United States Patent [19]
Bailey et al.

[11] Patent Number: 5,920,203
[45] Date of Patent: Jul. 6, 1999

[54] LOGIC DRIVEN LEVEL SHIFTER

[75] Inventors: James Arthur Bailey, Allentown; Angelo Rocco Mastrocola, West Lawn, both of Pa.

[73] Assignee: Lucent Technologies Inc., Murray Hill, N.J.

[21] Appl. No.: 08/773,453

[22] Filed: Dec. 24, 1996

[51] Int. Cl.$^6$ ............................................. H03K 19/0185
[52] U.S. Cl. ...................................... 326/68; 326/83
[58] Field of Search .................... 326/17, 68, 80, 326/81, 83; 327/52, 65, 434

[56] References Cited

U.S. PATENT DOCUMENTS

| | | | |
|---|---|---|---|
| 4,518,926 | 5/1985 | Swanson | 327/65 |
| 4,724,339 | 2/1988 | Ishida | 327/65 |
| 4,769,564 | 9/1988 | Garde | 327/52 |
| 4,908,530 | 3/1990 | Huang | 307/443 |
| 4,968,904 | 11/1990 | Yamashita et al. | 307/475 |
| 4,973,864 | 11/1990 | Nogami | 327/52 |
| 5,304,870 | 4/1994 | Nagasawa | 307/448 |
| 5,450,084 | 9/1995 | Mercer | 327/432 |

FOREIGN PATENT DOCUMENTS

| | | | |
|---|---|---|---|
| 59-216328 | 12/1984 | Japan | 326/80 |
| 62-176328 | 8/1987 | Japan | 326/68 |
| 2-301323 | 12/1990 | Japan | 326/80 |
| 4-278719 | 10/1992 | Japan | 326/83 |

Primary Examiner—Jon Santamauro
Assistant Examiner—Don Phu Le

[57] ABSTRACT

An improved complementary logic driven level shifter which typically improves switching speed over the prior art diode-type circuit, and allows for symmetrical delays for both high-to-low and low-to-high transitions, thus reducing settling times. The complementary CMOS and not-CMOS inputs to the level shifter are applied to the gates of a pair of P-channel FETs and also to the gates of a pair of N-channel FETs. The sources of the P-channel FETs are coupled to a current source. The drain of each P-channel FET is coupled to the drain of the N-channel FET to which its gate is coupled, and also to the anode of a diode. The cathodes of the two diodes, and the sources of the N-channel FETs are coupled together to the anode of a grounded cathode diode. The output SELECT is the common connection point of the drains of the FETs whose gates are coupled to not-CMOS, and the complementary not-SELECT output is the drains of the FETs whose gates are coupled to CMOS. In a second embodiment, the two diodes across the N-channel FETs are replaced by a diode from the current source to the anode of the grounded-cathode diode.

20 Claims, 2 Drawing Sheets

LOGIC DRIVEN LEVEL SHIFTER

FIELD OF THE INVENTION

The invention pertains to the field of electronic circuits. More particularly, the invention pertains to circuits for controlling the logic level of a control signal.

BACKGROUND OF THE INVENTION

It will be recognized by one skilled in the art that logic signals which are the inverse of each other are conventionally referred to as "signal" and "not-signal", meaning that when "signal" is a logical "1" (or "True"), then "not-signal" is a logical "0" (or "False"). It is conventional in schematics to indicate "not-signal" by the name of the signal with a line or bar over it, and this convention is followed in the figures. For typographical reasons, however, in this specification the inverse functions will be referred to as "not-(function)". Thus, it will be understood that "not-SELECT" in the following description is the same signal as "SELECT with a bar over it" in the figures.

In numerous CMOS designs it is important to control the logic levels of a control signal for analog functions to levels other than the power supplies. One instance where such logic level shifting is required is in high-speed current-mode digital-analog (D/A) converters. By operating a differential switch pair in saturation, glitches are reduced significantly.

FIG. 2 shows a portion of such a D/A converter for illustration. Field Effect Transistor (FET) devices (21) and (22) control outputs (20) which lead to additional switches, current sinks, etc., the nature of which is not material to this discussion.

The logic signals SELECT and not-SELECT are required to allow FETs (21) and (22) to remain either cut-off or in saturation, never in triode region, in order to reduce current glitches at the D/A output (20).

Previously, the circuit of FIG. 3 was commonly used to generate the logic level signals SELECT and not-SELECT. The input to the circuit of FIG. 3 is the control signal CMOS and its inverse not-CMOS. These signals control the gates of N-channel FETs (31) and (32), respectively, to switch the current source (30) through four diodes (33), (34), (35) and (36) and then through diode (37) to ground.

It should be noted, as shown in FIG. 3a, that in the circuit of FIG. 3, diodes (33) through (37) are usually implemented as N-channel FETs (39) with common gate-drain connections. The logic low level is set by the gate-source voltage ($V_{gs}$) for device (37), and the logic high level is set by $V_{gs}$ for device (37), and for devices (33) and (35) or (34) and (36), depending on the status of CMOS and not-CMOS. For simplicity, these FETs will continue to be referred to as "diodes".

The difficulty with the FIG. 3 circuit is the discharge path for high-low transitions at the output. For example, as SELECT changes from high to low, diodes (34) and (36) eventually turn off as their forward bias is reduced. The dynamic impedance increases markedly, increasing the time constant for discharging capacitance at SELECT node.

SUMMARY OF THE INVENTION

The invention presents an improved logic driven level shifter. The complementary inputs to the level shifter CMOS and not-CMOS are applied to the gates of a pair of P-channel FETs and also to the gates of a pair of N-channel FETs. The sources of the P-channel FETs are coupled to a current source. The drain of each P-channel FET is coupled at a common node to the drain of the N-channel FET to which its gate is coupled. The sources of the N-channel FETs are coupled together to the anode of a grounded-cathode diode, having a cathode coupled to ground. The output SELECT is coupled to the drains of the FETs whose gates are coupled to not-CMOS, and the complementary not-SELECT output is coupled to the drains of the FETs whose gates are coupled to CMOS.

In one embodiment, each common node is coupled to an anode of a diode having a cathode coupled to the anode of the grounded-cathode diode. In another embodiment, a diode is coupled from the current source to the common point of the sources of the N-channel FETs and the anode of the grounded-cathode diode.

The invention typically improves switching speed over the diode-type circuit, and allows for symmetrical delays for both high-to-low and low-to-high transitions, thus reducing the D/A settling times.

DESCRIPTION OF THE PREFERRED EMBODIMENT

Figure 1:
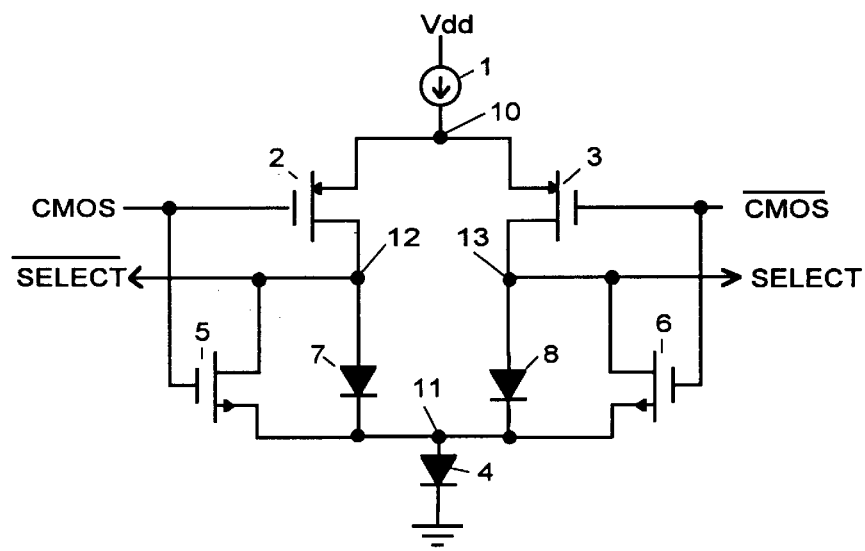
FIG. 1 shows a schematic diagram of the circuit of the invention.
Figure 2:
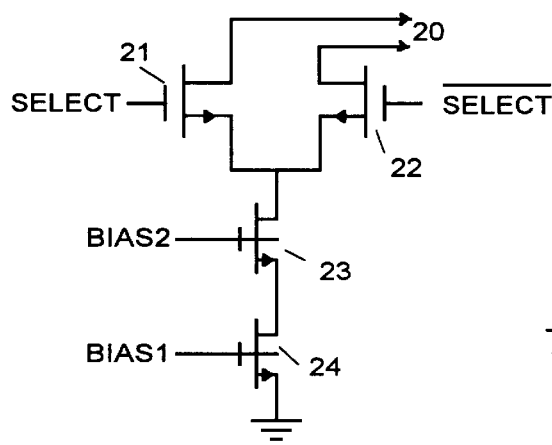
FIG. 2 shows a schematic diagram of a prior art D/A converter.

FIG. 1 shows the novel complementary logic-driven level-shifter circuit of the invention, used in an embodiment of a level-shifter having two complementary inputs CMOS and not-CMOS, and two complementary outputs SELECT and not-SELECT. Two of the level-shifters are used as "half-shifters"—one using the CMOS input to switch the not-SELECT output, the other using the not-CMOS input to switch the SELECT output.

The FETs used in the invention may be any such device with appropriate characteristics, as may be selected by one skilled in the art. Preferably, Metal Oxide Semiconductor FETs (MOSFETs) will be used, especially where the circuit of the invention is incorporated into an integrated circuit (IC).

Figure 3:
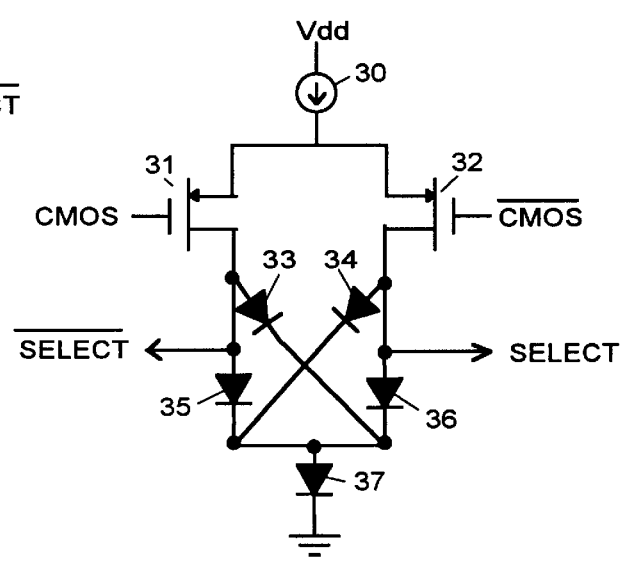
FIG. 3 shows a schematic diagram of a prior art level-shifter.
Figure 3A:
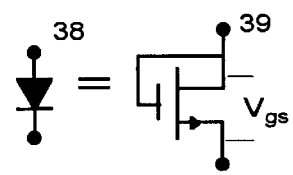
FIG. 3a shows how a FET with a common gate-drain connection is used to replace a diode.
Figure 4:
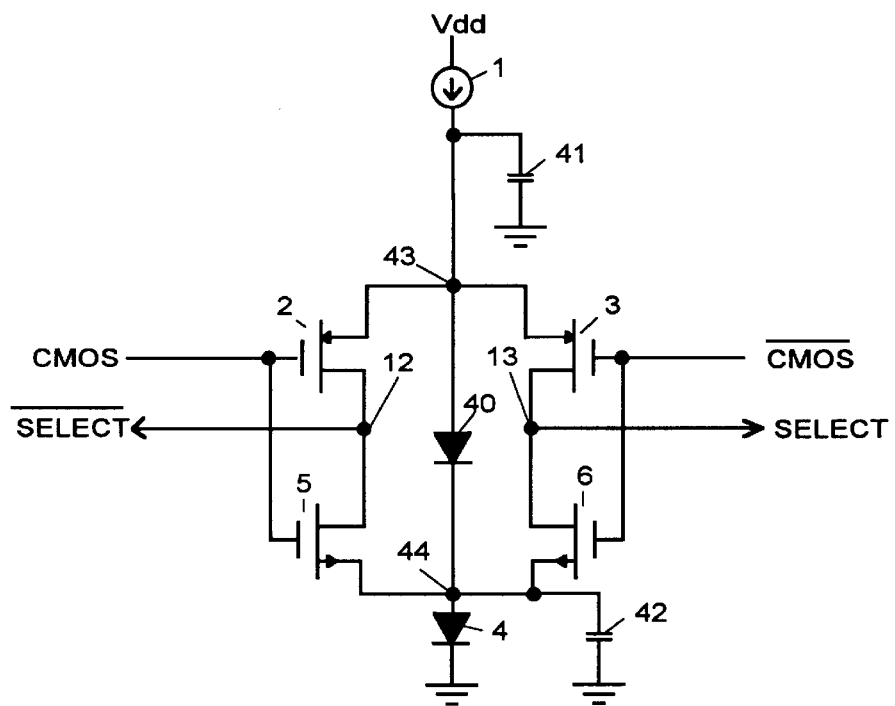
FIG. 4 shows a schematic diagram of a second embodiment of the invention in which two diodes are replaced by a single common diode.

It should be noted, as shown in FIG. 3a, that in the circuit of FIGS. 1 and 4, the "diodes" (4), (7), (8), and (40) may be bipolar diodes, or may actually be implemented as FETs (39) with common gate-drain connections, or may be other similar-functioning semiconductor devices as may be known to the art. For simplicity, however, these devices will continue to be referred to herein as "diodes". It will thus be understood by one skilled in the art that where the word "diode" is used in this disclosure, that this use is intended to comprise both bipolar diode devices and any other semiconductor devices (such as the gate-drain connected FET of FIG. 3a) which function similarly to P-N diodes in the sense of having a rectifying behavior, and/or a low impedance in the forward-biased state. Similarly, the use of the terms "anode" and "cathode" in connection with such "diodes" encompasses not only these terminals in bipolar diodes, but also the analogous terminals in the other semiconductor devices.

The first half-shifter comprises FETs (2) and (5) and diode (7), the second half-shifter comprises FETs (3) and (6) and diode (8). Source (1) and diode (4) are common to both shifters, and the combination of the two shifters creates one complementary-input, complementary-output logic-driven level shifter.

The sources of P-channel FETs (2) and (3) are coupled together and to a current source (1) fed by source voltage $V_{dd}$ at common point (10).

Describing the half-shifter switched by the CMOS signal first, the CMOS input to the level shifter is applied to the gate of P-channel FET (2) and also to the gate of N-channel FET (5). The drain of P-channel FET (2) is coupled to the drain of N-channel FET (5), and also to the anode of diode (7), at common drain point (12).

Similarly, the not-CMOS input to the level shifter is applied to the gate of P-channel FET (3) and also to the gate of N-channel FET (6). The drain of P-channel FET (3) is coupled to the drain of N-channel FET (6), and also to the anode of diode (7), at common drain point (13).

The cathodes of diodes (7) and (8), and the sources of the N-channel FETs (5) and (6) are coupled together at common point (11) to the anode of a single diode (4), whose cathode is grounded.

The output SELECT is taken from the common drain point (13) of the drains of FETs (3) and (6) (whose gates are coupled to not-CMOS) and the anode of diode (8), and the complementary not-SELECT output is taken from the common drain point (12) of the drains of FETs (2) and (5) (whose gates are coupled to CMOS) and the anode of diode (7).

In the circuit of the invention, FETs (5) and (6) provide a low-resistance discharge path for output capacitance. The circuit greatly improves switching speed and allows for symmetrical delays for both high-low and low-high transitions, thus reducing the D/A setting time.

FIG. 4 shows an alternate embodiment of the invention, with two half-shifters combined in a complementary-input/complementary-output level shifter similar to the embodiment of FIG. 1.

In the embodiment of FIG. 4, a single diode (40) replaces the two diodes (7) and (8) of FIG. 1. Diode (40) has its anode coupled to the connection point (43) of the current source (1) and the sources of the P-channel FETs (2) and (3), and its cathode coupled to the connection point (44) of the sources of N-channel FETs (5) and (6) and the anode of diode (4). The FETs, inputs and outputs remain coupled as in the embodiment of FIG. 1.

Optionally, capacitor (41) may be coupled from the current source (1) to ground, and capacitor (42) may be coupled from the anode of the grounded diode (4) to ground. These capacitors may actually speed up the pull-up on outputs SELECT and not-SELECT, because the capacitors serve as high-frequency low-impedance sources. Moreover, capacitor (41) may also provide added attenuation over certain frequencies of AC disturbances present on the power supply $V_{dd}$ (i.e, better AC power supply rejection).

The embodiment of FIG. 4 has at least three advantages over the embodiment of FIG. 1:

1. the single diode (40) helps provide a low output impedance for the level shifter outputs, in particular when they are used to pull an output up. Since node (43) is anchored as a lower impedance node than would node (10) in FIG. 1, the output impedance of the SELECT and not-SELECT outputs when pulling up is lower than in the circuit of FIG. 1, or in the prior art. Moreover, the capacitance on nodes (43) or (44) helps decrease the impedance for high frequencies when the outputs are pulling up or pulling down, respectively.

2. diode (40), unlike diodes (7) and (8), does not load down the SELECT and not-SELECT outputs and steal current which could be used to charge or discharge the outputs.

3. using one diode (40) instead of two (7) and (8) reduces the number of diodes required.

In a Digital to Analog (D/A) converter (DAC) using the level-shifters of the invention to switch current source differential pairs, multiple copies of the level-shifter of the invention will be used, one for each bit of the DAC. The level shifters can be paralleled by connecting all of the current source inputs ((43) in FIG. 4) on the paralleled level-shifters to a common point (FIG. 5, (55)), and also connecting all of the grounded-diode anode points ((44) in FIG. 4) to another common point (56). In this design the desirable parasitic capacitances of the level shifters at the points (43) and (44) are gathered together.

Figure 5:
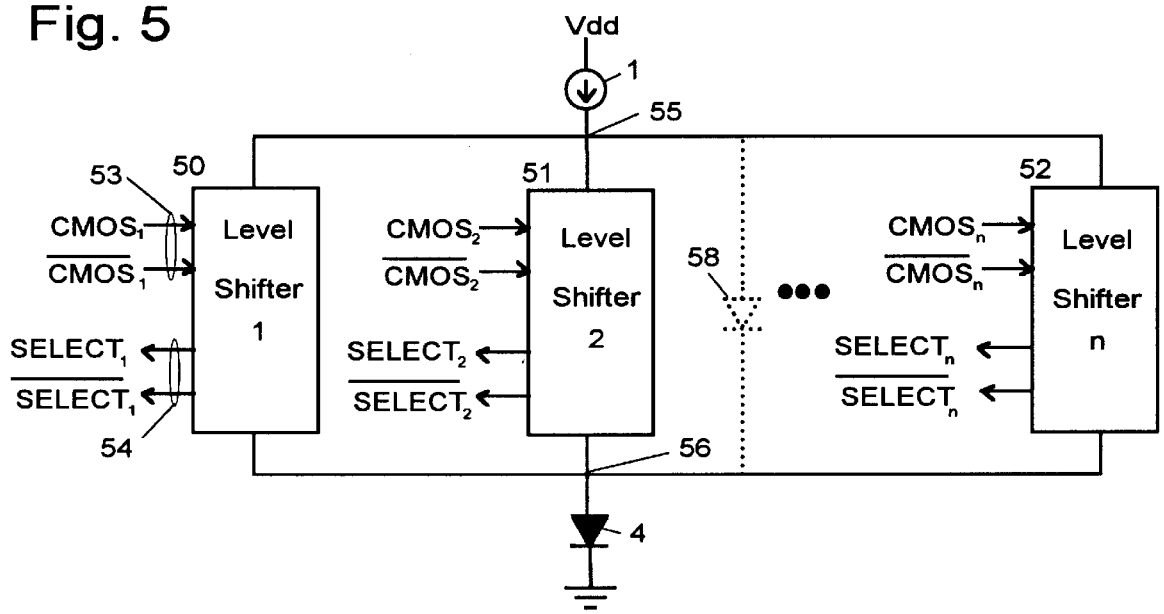
FIG. 5 shows how a number of the level shifters of the invention may be paralleled so as to gather parasitic capacitance together.

FIG. 5 shows such an arrangement, with level shifters for bits 1 (50), 2 (51) through bit n (52) being paralleled. Each level shifter has its own complementary CMOS inputs (53) and SELECT outputs (54), but the current source inputs are connected together at point (55) and the grounded-diode anode points are connected together at point (56).

If not all level shifters are switched at once in this arrangement, there is a gain in net benefit in terms of parasitic capacitance.

It is also possible to lump all of the diode (40)'s from the individual level-shifters (50), (51) . . . (52) into a single, admittedly larger, diode (58) (shown in dotted lines to indicate that this is an optional feature). This design could result in area savings over the separate diodes (40).

Of course, the more switching on the nodes (43) and (44), the more the current demands on the capacitors (41) and (42), and the less speed-up improvement in the SELECT outputs. There is also the possibility of cross-talk between stages.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. An integrated circuit having a logic-driven level shifter having a logic-level input and a controlled output responsive thereto, comprising:

current source having a current output;

a first diode having a cathode coupled to ground and an anode;

a first field effect transistor having a gate coupled to the logic-level input, a source coupled to the current source current output, and a drain coupled to a common drain point;

a second field effect transistor having a gate coupled to the logic-level input, a source coupled to the anode of the first diode, and a drain coupled to the common drain point, the common drain point comprising the controlled output of the level-shifter;

the first field effect transistor and the second field effect transistor being of complementary types; and a second diode having a cathode coupled to the anode of the first diode, and an anode coupled to the common drain point.

2. The integrated circuit of claim 1, in which the first field effect transistor is P-channel and the second field effect transistor is N-channel.

3. An integrated circuit having a logic-driven level shifter having a logic-level input and a controlled output responsive thereto, comprising:

a current source having a current output;

a first diode having a cathode coupled to ground and an anode;

a first field effect transistor having a gate coupled to the logic-level input, a source coupled to the current source current output, and a drain coupled to a common drain point;

a second field effect transistor having a gate coupled to the logic-level input, a source coupled to the anode of the first diode, and a drain coupled to the common drain point, the common drain point comprising the controlled output of the level-shifter;

the first field effect transistor and the second field effect transistor being of complementary types; and a second diode having a cathode coupled to the anode of the first diode, and an anode coupled to the source of the first field effect transistor.

4. The integrated circuit of claim 3, in which the first field effect transistor is P-channel and the second field effect transistor is N-channel.

5. An integrated circuit having a logic-driver level shifter having a logic-level input and a controlled output responsive thereto, comprising:

a current source having a current output coupled to ground and a current input;

a first diode having a cathode coupled to a voltage supply and an anode;

a first field effect transistor having a gate coupled to the logic-level input, a source coupled to the current source current input, and a drain coupled to a common drain point;

a second field effect transistor having a gate coupled to the logic-level input, a source coupled to the cathode of the first diode, and a drain coupled to the common drain point, the common drain point comprising the controlled output of the level-shifter;

the first field effect transistor and the second field effect transistor being of complementary types; and a second diode having an anode coupled to the cathode of the first diode, and a cathode coupled to the common drain point;

in which the first field effect transistor is N-channel and the second field effect transistor is P-channel.

6. An integrated circuit having a logic-driven level shifter having a logic-level input and a controlled output responsive thereto, comprising:

a current source having a current output coupled to ground and a current input;

a first diode having a cathode coupled to a voltage supply and an anode;

a first field effect transistor having a gate coupled to the logic-level input, a source coupled to the current source current input, and a drain coupled to a common drain point;

a second field effect transistor having a gate coupled to the logic-level input, a source coupled to the cathode of the first diode, and a drain coupled to the common drain point, the common drain point comprising the controlled output of the level-shifter;

the first field effect transistor and the second field effect transistor being of complementary types; and a second diode having a anode coupled to the cathode of the first diode, and a cathode coupled to the source of the first field effect transistor;

in which the first field effect transistor is N-channel and the second field effect transistor is P-channel.

7. A logic-driven level-shifter having first and second complementary inputs and first and second complementary outputs, comprising:

a current source having a current output;

a first diode having a cathode coupled to ground and an anode;

first and second half-shifters, each half-shifter comprising:

a current input and a return, a logic-level input;

a controlled output;

a first field effect transistor having a gate coupled to the logic-level input of the half-shifter; a source coupled to the current input, and a drain coupled to a common drain point;

a second field effect transistor having a gate coupled to the logic-level input of the half-shifter, a source coupled to the return and a drain coupled to the common drain point, such that the drain of the first field effect transistor and the drain of the second field effect transistor are coupled to the common drain point, the common drain point comprising the controlled output of the half-shifter;

the first field effect transistor and the second field effect transistor being of complementary types; and a second diode having a cathode coupled to the return, and an anode coupled to the common drain point;

the current inputs of the half-shifters being coupled to the current output of the current source;

the returns of the half-shifters being coupled to the anode of the first diode, the logic-level input of the first half-shifter being the first complementary input of the level-shifter and the controlled output of the first half-shifter being the first complementary output of the level-shifter; and the logic-level input of the second half-shifter being the second complementary input of the level-shifter and the controlled output of the second half-shifter being the second complementary output of the level-shifter.

8. The logic-driven level shifter of claim 7, in which the first field effect transistor of each half-shifter is P-channel and the second field effect transistor of each half-shifter is N-channel.

9. The logic-driven level shifter of claim 7, further comprising a capacitor having a first lead coupled to ground and a second lead coupled to the current output of the current source.

10. The logic-driven level shifter of claim 7, further comprising a capacitor having a first lead coupled to ground and a second lead coupled to the anode of the first diode.

11. The logic-driven level shifter of claim 7, further comprising a digital-to-analog converter having at least a pair of differential inputs, in which the differential inputs of the digital-to-analog converter are coupled to the complementary outputs of the level shifter.

12. The logic-driven level shifter of claim 11, in which the differential inputs of the digital-to-analog converter are coupled to the gates of a differential pair of field effect transistors.

13. A logic-driven level-shifter having first and second complementary inputs and first and second complementary outputs, comprising:
   a current source having a current output,
   a first diode having a cathode coupled to ground and an anode;
   first and second half-shifters, each half-shifter comprising:
      a current input and a return,
      a logic-level input;
      a controlled output;
      a first field effect transistor having a gate coupled to the logic-level input of the half-shifter, a source coupled to the current input, and a drain coupled to a common drain point;
      a second field effect transistor having a gate coupled to the logic-level input of the half-shifter, a source coupled to the return, and a drain coupled to the common drain point, such that the drain of the first field effect transistor and the drain of the second field effect transistor are coupled to the common drain point, the common drain point comprising the controlled output of the half-shifter;
      the first field effect transistor and the second field effect transistor being of complementary types; and
      a second diode having a cathode coupled to the anode of the first diode, and an anode coupled to the current output of the current source;
   the current inputs of the half-shifters being coupled to the current output of the current source;
   the returns of the half-shifters being coupled to the anode of the first diode;
   the logic-level input of the first half-shifter being the first complementary input of the level-shifter and the controlled output of the first half-shifter being the first complementary output of the level-shifter; and
   the logic-level input of the second half-shifter being the second complementary input of the level-shifter and the controlled output of the second half-shifter being the second complementary output of the level-shifter.

14. The logic-driven level shifter of claim 13, in which the first field effect transistor of each half-shifter is P-channel and the second field effect transistor of each half-shifter is N-channel.

15. The logic-driven level shifter of claim 13, further comprising a capacitor having a first lead coupled to ground and a second lead coupled to the current output of the current source.

16. The logic-driven level shifter of claim 13, further comprising a capacitor having a first lead coupled to ground and a second lead coupled to the anode of the first diode.

17. The logic-driven level shifter of claim 13, further comprising a digital-to-analog converter having at least a pair of differential inputs, in which the differential inputs of the digital-to-analog converter are coupled to the complementary outputs of the level shifter.

18. The logic-driven level shifter of claim 17, in which the differential inputs of the digital-to-analog converter are coupled to the gates of a differential pair of field effect transistors.

19. A logic-driven level-shifter having first and second complementary inputs and first and second complementary outputs, comprising:
   a current source having a current input;
   a first diode having an anode coupled to a voltage source and an anode;
   first and second half-shifters, each half-shifter comprising:
      a current output and a voltage source,
      a logic-level input;
      a controlled output;
      a first field effect transistor having a gate coupled to the logic-level input of the half-shifter, a source coupled to the current output, and a drain coupled to a common drain point;
      a second field effect transistor having a gate coupled to the logic-level input of the half-shifter, a source coupled to the voltage source, and a drain coupled to the common drain point, such that the drain of the first field effect transistor and the drain of the second field effect transistor are coupled to the common drain point, the common drain point comprising the controlled output of the half-shifter;
      the first field effect transistor and the second field effect transistor being of complementary types; and
      a second diode having an anode coupled to the voltage source, and a cathode coupled to the common drain point;
   the current outputs of the half-shifters being coupled to the current input of the current source;
   the returns of the half-shifters being coupled to the anode of the first diode;
   the logic-level input of the first half-shifter being the first complementary input of the level-shifter and the controlled output of the first half-shifter being the first complementary output of the level-shifter; and
   the logic-level input of the second half-shifter being the second complementary input of the level-shifter and the controlled output of the second half-shifter being the second complementary output of the level-shifter;
   in which the first field effect transistor of each half-shifter is N-channel and the second field effect transistor of each half-shifter is P-channel.

20. A logic-driven level-shifter having first and second complementary inputs and first and second complementary outputs, comprising:
   a current source having a current input;
   a first diode having an anode coupled to a voltage source and an anode;
   first and second half-shifters, each half-shifter comprising:
      a current output and a voltage source,
      a logic-level input;
      a controlled output;
      a first field effect transistor having a gate coupled to the logic-level input of the half-shifter, a source coupled to the current output, and a drain coupled to a common drain point;
      a second field effect transistor having a gate coupled to the logic-level input of the half-shifter, a source coupled to the voltage source, and a drain coupled to the common drain point, such that the drain of the first field effect transistor and the drain of the second field effect transistor are coupled to the common drain point, the common drain point comprising the controlled output of the half-shifter;

the first field effect transistor and the second field effect transistor being of complementary types; and a second diode having a cathode coupled to the anode of the first diode, and an anode coupled to the current output of the current source;

the current outputs of the half-shifters being coupled to the current input of the current source;

the returns of the half-shifters being coupled to the anode of the first diode;

the logic-level input of the first half-shifter being the first complementary input of the level-shifter and the controlled output of the first half-shifter being the first complementary output of the level-shifter; and the logic-level input of the second half-shifter being the second complementary input of the level-shifter and the controlled output of the second half-shifter being the second complementary output of the level-shifter;

in which the first field effect transistor of each half-shifter is N-channel and the second field effect transistor of each half-shifter is P-channel.

* * * * *